United States Patent
Nakagawa et al.

(10) Patent No.: US 11,476,056 B2
(45) Date of Patent: Oct. 18, 2022

(54) CAPACITOR AND METHOD FOR MANUFACTURING THE SAME

(71) Applicant: Murata Manufacturing Co., Ltd., Nagaokakyo (JP)

(72) Inventors: Hiroshi Nakagawa, Nagaokakyo (JP); Tomoyuki Ashimine, Nagaokakyo (JP); Yasuhiro Murase, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 17/065,879

(22) Filed: Oct. 8, 2020

(65) Prior Publication Data

US 2021/0027950 A1 Jan. 28, 2021

Related U.S. Application Data

(63) Continuation of application No. PCT/JP2019/019907, filed on May 20, 2019.

(30) Foreign Application Priority Data

Jun. 15, 2018 (JP) ............................. JP2018-114893

(51) Int. Cl.
*H01L 29/76* (2006.01)
*H01L 27/108* (2006.01)
(Continued)

(52) U.S. Cl.
CPC ............... *H01G 4/33* (2013.01); *H01G 4/018* (2013.01); *H01L 27/10829* (2013.01)

(58) Field of Classification Search
CPC .... H01G 4/33; H01G 4/018; H01L 27/10829; H01L 21/822; H01L 27/04
(Continued)

(56) References Cited

U.S. PATENT DOCUMENTS

| 4,918,503 A | 4/1990 | Okuyama |
| 6,436,756 B1 | 8/2002 | Nishimura et al. |

(Continued)

FOREIGN PATENT DOCUMENTS

| CN | 110574154 A | 12/2019 |
| JP | H6427252 A | 1/1989 |

(Continued)

OTHER PUBLICATIONS

I. A. Shareef et al.; Subatmospheric chemical vapor deposition ozone/TEOS process for SiO2 trench filling; Journal of Vacuum Science and Technology B, vol. 13, No. 4, p. 1888-1892; Jul./Aug. 1995.

(Continued)

*Primary Examiner* — Theresa T Doan
(74) *Attorney, Agent, or Firm* — ArentFox Schiff LLP

(57) ABSTRACT

A capacitor that includes a substrate, a dielectric portion, and a conductor layer. The dielectric portion includes a thick film portion and a thin film portion. The thick film portion has a thickness larger than the average thickness of the dielectric portion in a direction perpendicular to the first main surface. The thin film portion has a thickness smaller than the average thickness of the dielectric portion in the direction perpendicular to the first main surface. The thick film portion has a larger relative permittivity than the thin film portion.

13 Claims, 1 Drawing Sheet

(51) Int. Cl.
*H01G 4/33* (2006.01)
*H01G 4/018* (2006.01)

(58) Field of Classification Search
USPC .......................................................... 257/301
See application file for complete search history.

(56) References Cited

U.S. PATENT DOCUMENTS

| | | | | |
|---|---|---|---|---|
| 10,665,663 | B1* | 5/2020 | Fernandes | ......... H01L 21/28518 |
| 2002/0093781 | A1* | 7/2002 | Bachhofer | ........ H01L 21/02337 |
| | | | | 361/312 |
| 2004/0043558 | A1 | 3/2004 | Wieczorek et al. | |
| 2015/0235767 | A1 | 8/2015 | Aotani et al. | |
| 2016/0020030 | A1 | 1/2016 | Aotani et al. | |
| 2019/0378893 | A1 | 12/2019 | Ashimine et al. | |

FOREIGN PATENT DOCUMENTS

| | | |
|---|---|---|
| JP | S6480059 A | 3/1989 |
| JP | H01179443 A | 7/1989 |
| JP | H04286356 A | 10/1992 |
| JP | H4365369 A | 12/1992 |
| JP | H11145387 A | 5/1999 |
| JP | 2005537652 A | 12/2005 |
| JP | 2015126156 A | 7/2015 |

OTHER PUBLICATIONS

International Search Report Issued for PCT/JP2019/019907, dated Jul. 30, 2019.
Written Opinion of the International Searching Authority issued for PCT/JP2019/019907, dated Jul. 30, 2019.
Chinese Office Action issued for Chinese Application No. 201980021921.7, date of issuance of Office Action dated Nov. 26, 2021.

* cited by examiner

US 11,476,056 B2

CAPACITOR AND METHOD FOR MANUFACTURING THE SAME

CROSS REFERENCE TO RELATED APPLICATIONS

The present application is a continuation of International application No. PCT/JP2019/019907, filed May 20, 2019, which claims priority to Japanese Patent Application No. 2018-114893, filed Jun. 15, 2018, the entire contents of each of which are incorporated herein by reference.

FIELD OF THE INVENTION

The present invention relates to a capacitor and a method for manufacturing the capacitor.

BACKGROUND OF THE INVENTION

J. Vac. Sci. Technol. B, Vol. 13, No. 4 P. 1888-1892 (Non-Patent Document 1) is a prior art document disclosing the configuration of a capacitor. The capacitor described in Non-Patent Document 1 is a silicon trench capacitor. This silicon trench capacitor has an $SiO_2$ film formed using tetraethoxysilane (TEOS)+$O_3$ gas. The thickness of the $SiO_2$ film is large on the upper end side of the trench and small on the lower end side of the trench.

Non-Patent Document 1: J. Vac. Sci. Technol. B Vol. 13, No. 4 P. 1888-1892

SUMMARY OF THE INVENTION

The thickness of the dielectric portion of a capacitor is sometimes not uniform. The dielectric portion of the capacitor described in Non-Patent Document 1 is formed along the recess of the substrate, and the film thickness at the upper end of the recess is large, and the film thickness at the lower end of the recess is small. In the case that the thickness of the dielectric portion is not uniform as described above, the average thickness of the dielectric portion is set so that the withstand voltage performance is ensured in the thin film portion of the dielectric portion. Therefore, in the thick film portion, the thickness of the dielectric layer is too large, and the electrostatic capacitance of the capacitor is deceased.

The present invention has been made in view of the above-described problem, and an object of the present invention is to provide a capacitor and a method for manufacturing the capacitor in which the decrease in the electrostatic capacitance in the thick film portion can be suppressed while the withstand voltage performance in the thin film portion is maintained in the dielectric portion in which the thickness is non-uniform in the capacitor.

The capacitor according to the present invention includes a substrate, a dielectric portion, and a conductor layer. The substrate includes a first main surface and a second main surface opposite the first main surface. The dielectric portion is laminated along the first main surface and includes at least one dielectric layer. The dielectric portion includes a thick film portion and a thin film portion. The thick film portion has a thickness larger than an average thickness of the dielectric portion in a direction perpendicular to the first main surface. The thin film portion has a thickness smaller than the average thickness of the dielectric portion in the direction perpendicular to the first main surface. The thick film portion has a larger relative permittivity than the thin film portion. The conductor layer is on the dielectric portion.

According to the present invention, in the dielectric portion in which the thickness is non-uniform in the capacitor, the decrease in the electrostatic capacitance in the thick film portion can be suppressed by increasing the relative permittivity of the thick film portion while the withstand voltage performance in the thin film portion is maintained.

DETAILED DESCRIPTION OF THE INVENTION

Figure 1:
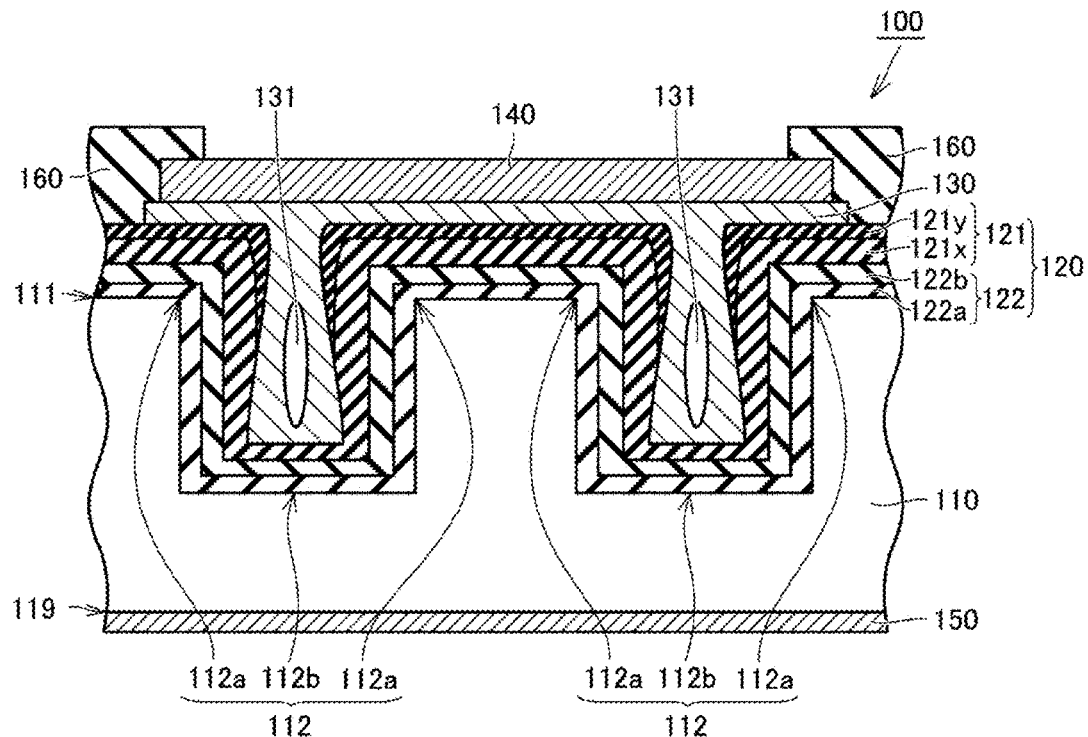
FIG. 1 is a sectional view showing a structure of a capacitor according to an embodiment of the present invention.

Hereinafter, a capacitor according to an embodiment of the present invention will be described with reference to the drawings. In the following description of the embodiment, the same or corresponding parts in the drawings will be denoted by the same reference symbol and the description thereof will not be repeated.

FIG. 1 is a sectional view showing a structure of a capacitor according to an embodiment of the present invention. As shown in FIG. 1, a capacitor 100 according to an embodiment of the present invention includes a substrate 110, a dielectric portion 120, and a conductor layer 130.

The substrate 110 includes a first main surface 111 and a second main surface 119 opposite the first main surface 111.

In the present embodiment, a recess 112 is formed in the first main surface 111. The recess 112 includes an upper end 112a and a lower end 112b. The upper end 112a is located at the upper end of the peripheral side surface of the recess 112, and the lower end 112b is located at the bottom of the recess 112. The depth of the recess 112 is, for example, 20.8 μm, and the width of the recess 112 is, for example, 3.9 μm. Note that the recess 112 is not necessarily required to be formed in the first main surface 111. That is, the entire first main surface 111 may be flat.

The substrate 110 is a silicon substrate. The material of the substrate 110 is not limited to silicon, and may be another semiconductor such as gallium arsenide.

The dielectric portion 120 is laminated along the first main surface 111. The dielectric portion 120 includes at least one dielectric layer. In the present embodiment, the dielectric portion 120 includes a plurality of dielectric layers as the at least one dielectric layer. The plurality of dielectric layers include an outermost dielectric layer 121 and at least one inner dielectric layer 122. The dielectric portion 120 may have only the outermost dielectric layer 121 as the dielectric layer.

The outermost dielectric layer 121 is located on a conductor layer 130 side in the dielectric portion 120. The inner dielectric layer 122 is located on the substrate 110 side relative to the outermost dielectric layer 121. In the present embodiment, the plurality of dielectric layers include a first inner dielectric layer 122a and a second inner dielectric layer 122b as the inner dielectric layer 122. The plurality of dielectric layers may be configured to include only one inner dielectric layer 122.

That is, in the present embodiment, the first inner dielectric layer 122a is laminated on the first main surface 111 of the substrate 110. The second inner dielectric layer 122b is laminated on the first inner dielectric layer 122a. The outermost dielectric layer 121 is laminated on the second inner dielectric layer 122b.

The outermost dielectric layer 121 has a larger maximum layer thickness than the inner dielectric layer. In the present embodiment, the outermost dielectric layer 121 has a larger maximum layer thickness than the first inner dielectric layer 122a and the second inner dielectric layer 122b.

The at least one dielectric layer includes a doped dielectric layer doped with an impurity that increases a relative permittivity. In the present embodiment, the outermost dielectric layer 121 is the doped dielectric layer. The present embodiment is not limited to the case where the outermost dielectric layer 121 is the doped dielectric layer, and one inner dielectric layer may be the doped dielectric layer.

The outermost dielectric layer 121 being the doped dielectric layer includes a base portion 121x that is a region in which the impurity for the doping is not diffused, and a doped portion 121y that is a region in which the impurity for the doping is diffused. The base portion 121x is preferably an oxide. In the present embodiment, the base portion 121x includes $SiO_2$, and the relative permittivity of the base portion 121x is approximately 3.9.

The doped portion 121y is located on the conductor layer 130 side of a part of the base portion 121x. In the present embodiment, the doped portion 121y includes silicon oxynitride formed by doping $SiO_2$ with a nitrogen atom as an impurity, as described below.

The doped portion 121y includes a region in which the concentration of the impurity is increased where the conductor layer 130 is closest thereto in the direction perpendicular to the first main surface 111. The doped portion 121y may include a region in which the concentration of the impurity is increased where the substrate 110 is closest thereto in the direction perpendicular to the first main surface 111.

In the present embodiment, the concentration of the impurity is increased where the conductor layer 130 is closest thereto in the direction perpendicular to the first main surface 111 in the doped portion 121y. As a result, the relative permittivity is increased where the conductor layer 130 is closest in the direction perpendicular to the first main surface 111 in the doped portion 121y. In the present embodiment, the relative permittivity of the doped portion 121y is approximately 3.9 to 7. In the present embodiment, the doping is performed using a nitrogen atom as an impurity, but the impurity is not limited to a nitrogen atom and may be a metal element such as Hf, Zr, or Ta.

The material of the inner dielectric layer 122 preferably includes an oxide such as $SiO_2$, $Al_2O_3$, $HfO_2$, $Ta_2O_5$, or $ZrO_2$, or a nitride such as $Si_3N_4$. In the present embodiment, the first inner dielectric layer 122a is an oxide, and specifically includes $SiO_2$. The second inner dielectric layer 122b is a nitride, and specifically includes $Si_3N_4$.

That is, in the present embodiment, the oxide included in the first inner dielectric layer 122a, the nitride included in the second inner dielectric layer 122b, and the oxide included in the base portion 121x of the outermost dielectric layer 121 that is the doped dielectric layer form a so-called "ONO structure". Because the ONO structure is a structure in which a layer having a low bandgap is sandwiched between two layers having a high bandgap, the leakage current characteristic and the insulation resistance can be improved, and as a result, the withstand voltage performance of the dielectric portion 120 having the ONO structure can be easily maintained.

Figure 2:
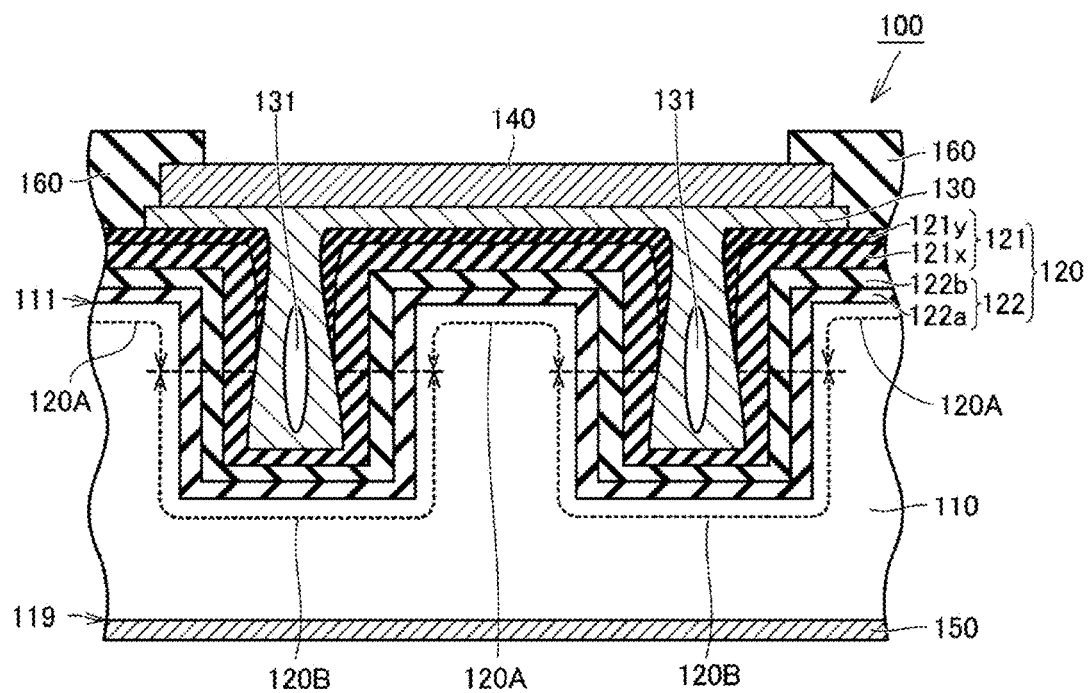
FIG. 2 is a sectional view showing a range of each of a thick film portion and a thin film portion in a dielectric portion of a capacitor according to an embodiment of the present invention.

Here, the thick film portion and the thin film portion in the dielectric portion 120 will be described. FIG. 2 is a sectional view showing a range of each of a thick film portion and a thin film portion in a dielectric portion of a capacitor according to an embodiment of the present invention. As shown in FIG. 2, the dielectric portion 120 includes a thick film portion 120A and a thin film portion 120B.

The thick film portion 120A has a thickness larger than the average thickness of the dielectric portion 120 in the direction perpendicular to the first main surface 111. The upper end 112a shown in FIG. 1 is covered with the thick film portion 120A. Specifically, the upper part of the peripheral side surface of the recess 112 and the part other than the recess in the first main surface 111 are covered with the thick film portion 120A.

The thin film portion 120B has a thickness smaller than the average thickness of the dielectric portion 120 in the direction perpendicular to the first main surface 111. The lower end 112b shown in FIG. 1 is covered with the thin film portion 120B. Specifically, the bottom of the recess 112 and the lower part of the peripheral side surface of the recess 112 are covered with the thin film portion 120B.

In the present embodiment, the thick film portion 120A in the outermost dielectric layer 121 has a larger average layer thickness than the thin film portion 120B in the outermost dielectric layer 121. The thick film portion 120A in the inner dielectric layer 122 has substantially the same average layer thickness as, or a slightly larger average layer thickness than, the thin film portion 120B in the inner dielectric layer 122.

Furthermore, in the present embodiment, the thick film portion 120A in the doped portion 121y has a larger average thickness than the thin film portion 120B in the doped portion 121y. The doped portion 121y is not required to be included in the thin film portion 120B. That is, because the impurity is diffused in the thick film portion 120A more than in the thin film portion 120B, the thick film portion 120A has a larger relative permittivity than the thin film portion 120B.

The average thickness of the dielectric portion 120, the average layer thickness of the thick film portion 120A in the outermost dielectric layer 121, the average layer thickness of the thin film portion 120B in the outermost dielectric layer 121, the average layer thickness of the thick film portion 120A in the inner dielectric layer 122, the average layer thickness of the thin film portion 120B in the inner dielectric layer 122, the average thickness of the thick film portion 120A in the doped portion 121y, and the average thickness of the thin film portion 120B in the doped portion 121y can be each determined by, for example, taking the average of the physical film thickness values measured at a plurality of points from the micrograph of the sectional structure of the dielectric portion 120 photographed using a transmission electron microscope. Alternatively, each of the plurality of average thicknesses and the plurality of average layer thicknesses can be measured using an optical film thickness meter. Furthermore, in the case that the facing area (S) between the substrate 110 and the conductor layer 130, and the dielectric constant (ε) of the dielectric portion 120 are each known, the average thickness (d) of the dielectric portion 120 can also be calculated from the electrostatic capacitance (C) of the capacitor 100 based on the formula: d=ε×S/C. The method for measuring the plurality of average thicknesses and the plurality of average layer thicknesses is not limited to the above-described method.

The thick film portion 120A in the doped dielectric layer includes a region in which the concentration of the impurity is increased where the conductor layer 130 is closest thereto in the direction perpendicular to the first main surface 111.

In the present embodiment, the concentration of the impurity is increased where the conductor layer 130 is closest thereto in the direction perpendicular to the first main surface 111 in the thick film portion 120A in the doped dielectric layer. Specifically, the concentration of the impurity is increased where the conductor layer 130 is closest in the direction perpendicular to the first main surface 111 in the thick film portion 120A in the doped portion 121y of the outermost dielectric layer 121.

The concentration of the impurity can be measured by secondary ion mass spectrometry (SIMS) after observing the sectional structure of the dielectric portion 120 with a transmission electron microscope (TEM) or a scanning electron microscope (SEM).

As shown in FIG. 1, the conductor layer 130 is located on the side opposite from the substrate 110 side of the dielectric portion 120. The conductor layer 130 is formed so that the substrate 110 side of the conductor layer 130 is along the dielectric portion 120. The conductor layer 130 is formed so that the side opposite from the substrate 110 side of the conductor layer 130 is substantially parallel to the first main surface 111 other than the recess 112.

When the capacitor 100 is viewed from the side of a first electrode 140 described below, the outer edge of the conductor layer 130 is located inside the outer edge of the dielectric portion 120. In the present embodiment, the conductor layer 130 includes polysilicon. The material included in the conductor layer 130 is not limited to polysilicon and may be any conductor.

In the present embodiment, a hole 131 is formed in the part of the conductor layer 130 located inside the recess 112. The hole 131 is located on the central axis of the recess 112 perpendicular to the bottom of the recess 112. However, the hole 131 is not necessarily required to be formed.

The capacitor 100 according to the present embodiment further includes a first electrode 140. The first electrode 140 is located on the side opposite from the dielectric portion 120 of the conductor layer 130. Specifically, the first electrode 140 is laminated on the conductor layer 130. When the capacitor 100 is viewed from the first electrode 140 side, the outer edge of the first electrode 140 is located inside the outer edge of the conductor layer 130.

The material of the first electrode 140 is not particularly limited as long as the material is a conductive material, and is preferably a metal such as Cu, Ag, Au, Al, Pt, Ni, Cr, or Ti, or an alloy containing at least one of these metals. In the present embodiment, the first electrode 140 includes Al.

The capacitor 100 according to the present embodiment further includes a second electrode 150. The second electrode 150 is located on the second main surface 119 of the substrate 110. Specifically, the second electrode 150 is laminated on the second main surface 119 and provided over the entire second main surface 119.

The material of the second electrode 150 is not particularly limited as long as the material is a conductive material, and is preferably a metal such as Cu, Ag, Au, Al, Pt, Ni, Cr, or Ti, or an alloy containing at least one of these metals.

The capacitor 100 according to the present embodiment further includes a protective layer 160. The protective layer 160 is located on the first main surface 111 side of the substrate 110. The protective layer 160 is laminated so that only the first electrode 140 and the protective layer 160 are exposed to the outside of the capacitor 100 on the first main surface 111 side of the substrate 110. The protective layer 160 preferably includes an oxide such as silicon oxide or a nitride such as silicon nitride.

Hereinafter, a method for manufacturing a capacitor 100 according to an embodiment of the present invention will be described.

First, a recess 112 is formed in a first main surface 111 of a substrate 110 by photolithography. Specifically, a resist is applied to the first main surface 111 of the substrate 110, and a part of the resist is removed to form a hole pattern. After that, dry etching is performed to form the recess 112 at the position where the hole pattern is formed on the first main surface 111.

Next, at least one dielectric layer is laminated along the first main surface 111 of the substrate 110 to form a dielectric portion 120. At this time, the dielectric portion 120 is formed so that the dielectric portion 120 includes a thick film portion 120A and a thin film portion 120B.

In the present embodiment, the first main surface 111 side of the substrate 110 is thermally oxidized to form a first inner dielectric layer 122a on the first main surface 111. Specifically, the first main surface 111 side of the silicon substrate is thermally oxidized to form an $SiO_2$ layer that is the first inner dielectric layer 122a on the first main surface 111.

Next, a second inner dielectric layer 122b is formed on the first inner dielectric layer 122a by the LPCVD (low pressure chemical vapor deposition) method. Specifically, an $Si_3N_4$ layer is formed on the $SiO_2$ layer that is the first inner dielectric layer 122a by the LPCVD method.

Next, an outermost dielectric layer 121 is formed on the second inner dielectric layer 122b. In the present embodiment, when the outermost dielectric layer 121 is formed, an $SiO_2$ layer is first formed by the LPCVD method using a TEOS gas. In the state that the $SiO_2$ layer is formed, the thick film portion 120A and the thin film portion 120B are defined.

Next, the dielectric portion 120 is doped with an impurity. At this time, the dielectric portion 120 is doped with the impurity so that the thick film portion 120A has a larger relative permittivity than the thin film portion 120B.

In the present embodiment, the $SiO_2$ layer included in the outermost dielectric layer 121 is plasma-nitrided for the doping with a nitrogen atom as the impurity. However, for the doping with a nitrogen atom as the impurity, the $SiO_2$ layer included in the outermost dielectric layer 121 may be heat-treated in an ammonia gas atmosphere. As a result, the outermost dielectric layer 121 that is formed includes a base portion 121x in which the nitrogen atom used for the doping is not diffused, and a doped portion 121y in which the nitrogen atom used for the doping is diffused and silicon oxynitride is included therein. In the case that the impurity is a metal element, doping can be performed with the metal element as the impurity by a method such as sputtering.

In the present embodiment, an upper end 112a is covered with the thick film portion 120A, and a lower end 112b is covered with the thin film portion 120B. When the $SiO_2$ layer included in the outermost dielectric layer 121 is plasma-nitrided, the thick film portion 120A covering the upper end 112a is doped with a nitrogen atom more than the thin film portion 120B covering the lower end 112b, and the concentration of the nitrogen atom in the thick film portion 120A is increased because the life of the nitrogen atom in the plasma nitriding treatment is short. When the concentration of the nitrogen atom in the silicon oxynitride included in the doped portion 121y is increased, the relative permittivity of the silicon oxynitride is increased.

As a result, the part included in the thick film portion 120A in the doped portion 121y has a larger relative permittivity than the part included in the thin film portion 120B in the doped portion 121y. The thick film portion 120A consequently has a larger relative permittivity than the thin film portion 120B.

In the case that the above-described plasma nitriding treatment is performed, the concentration of the impurity in the doped portion 121y is sometimes increased in the direction perpendicular to the first main surface 111 toward the side opposite from the substrate 110 side of the dielectric portion 120.

When the SiO$_2$ layer included in the outermost dielectric layer 121 is heat-treated in an ammonia gas atmosphere, the concentration of the impurity in the doped portion 121y is sometimes increased in the direction perpendicular to the first main surface 111 toward the substrate 110 side of the dielectric portion 120. Alternatively, when the SiO$_2$ layer included in the outermost dielectric layer 121 is heat-treated in an ammonia gas atmosphere, the concentration of the impurity is sometimes increased toward the center of the doped portion 121y in the direction perpendicular to the first main surface 111. That is, the concentration of the impurity in the central portion of the doped portion 121y in the direction perpendicular to the first main surface 111 is sometimes the highest.

In the case that a part in the doped portion 121y is included in the thin film portion 120B, the oxidation treatment of the part leads to the suppression of the decrease in the withstand voltage performance in the thin film portion 120B and, consequently, the improvement in the withstand voltage performance of the capacitor 100.

Next, the conductor layer 130 is laminated on the side opposite from the substrate 110 side of the dielectric portion 120. Specifically, a polysilicon layer that is the conductor layer 130 is formed on the outermost dielectric layer 121 by the LPCVD method.

Next, the conductor layer 130 is patterned by photolithography. Specifically, a resist is applied to the conductor layer 130, and a part of the resist is removed to form a pattern. After that, dry etching is performed to remove the part other than the electrode region of the conductor layer 130.

Next, a first electrode 140 is formed on the conductor layer 130. Specifically, a layer including Al that is the first electrode 140 is deposited on the conductor layer 130 by a method such as sputtering or vapor deposition.

Next, a protective layer 160 is laminated on the side opposite from the substrate 110 side of each of the dielectric portion 120, the conductor layer 130, and the first electrode 140. Then, the protective layer 160 is etched to pattern the protective layer 160. As a result, the first electrode 140 is exposed. A second electrode 150 is formed on the second main surface 119 of the substrate 110 after any of the above-described steps.

Through the above-described steps, a capacitor 100 according to an embodiment of the present invention as shown in FIG. 1 is manufactured.

As described above, in the capacitor 100 according to the present embodiment, because the thick film portion 120A has a larger relative permittivity than the thin film portion 120B in the dielectric portion 120, the decrease in the electrostatic capacitance in the thick film portion 120A can be suppressed by increasing the relative permittivity of the thick film portion 120A while the withstand voltage performance in the thin film portion 120B is maintained in the dielectric portion 120 in which the thickness is non-uniform.

Furthermore, in the capacitor 100 according to the present embodiment, because the upper end 112a of the recess 112 is covered with the thick film portion 120A, the electric field concentration at the upper end 112a of the recess 112 can be relaxed, and the impurity is easily diffused into the thick film portion 120A to effectively increase the relative permittivity of the thick film portion 120A, so that the electrostatic capacitance of the thick film portion 120A can be ensured.

Because the lower end 112b of the recess 112 is covered with the thin film portion 120B, the diffusion of the impurity into the thin film portion 120B is suppressed, and the withstand voltage performance and the electrostatic capacitance in the thin film portion 120B can be maintained.

Furthermore, because the outermost dielectric layer 121 has a larger maximum layer thickness than the inner dielectric layer, the inner dielectric layer is interposed between the outermost dielectric layer 121 that is the thickest dielectric layer and the substrate 110. As a result, the internal stress generated between the outermost dielectric layer 121 and the substrate 110 can be relaxed by the inner dielectric layer, and therefore, the occurrence of a crack between the layers in the dielectric portion 120 can be suppressed, and the warp of the substrate 110 can be suppressed to be small.

Furthermore, because the dielectric layer includes the doped dielectric layer doped with the impurity that increases the relative permittivity, the relative permittivity of each of the thick film portion 120A and the thin film portion 120B in the dielectric portion 120 can be controlled.

Furthermore, the thick film portion 120A in the doped dielectric layer includes the region in which the concentration of the impurity is increased as the conductor layer 130 is closest, or the region in which the concentration of the impurity is increased as the substrate 110 is closest, in the direction perpendicular to the first main surface 111. As a result, the relative permittivity can be increased in the region where the concentration of the impurity is increased.

Furthermore, the doping with the impurity is performed in the thick film portion 120A in the doped dielectric layer so that the concentration of the impurity is increased when the conductor layer 130 is closest thereto in the direction perpendicular to the first main surface 111. As a result, the diffusion of the impurity into the thin film portion 120B can be suppressed.

Furthermore, in the method for manufacturing the capacitor according to the present embodiment, the dielectric portion 120 is formed so that the dielectric portion 120 includes the thick film portion 120A having a thickness larger than the average thickness of the dielectric portion 120 and the thin film portion 120B having a thickness smaller than the average thickness in the direction perpendicular to the first main surface 111, and the dielectric portion 120 is doped with the impurity so that the thick film portion 120A has a larger relative permittivity than the thin film portion 120B, so that the decrease in the electrostatic capacitance in the thick film portion 120A can be suppressed while the withstand voltage performance in the thin film portion 120B is maintained in the dielectric portion 120 in which the thickness is non-uniform.

Embodiments that are disclosed this time are to be considered as an example in all respects and not restrictive. The scope of the present invention is shown not by the above description but by the claims, and is intended to include meaning equivalent to the claims and all modifications within the scope.

DESCRIPTION OF REFERENCE SYMBOLS

100: Capacitor
110: Substrate
111: First main surface

112: Recess
112a: Upper end
112b: Lower end
119: Second main surface
120: Dielectric portion
120A: Thick film portion
120B: Thin film portion
121: Outermost dielectric layer
121x: Base portion
121y: Doped portion
122: Inner dielectric layer
122a: First inner dielectric layer
122b: Second inner dielectric layer
130: Conductor layer
131: Hole
140: First electrode
150: Second electrode
160: Protective layer

The invention claimed is:

1. A capacitor comprising:
a substrate including a first main surface and a second main surface opposite the first main surface;
a dielectric portion including at least one dielectric layer along the first main surface, wherein the dielectric portion includes a thick film portion having a thickness larger than an average thickness of the dielectric portion and a thin film portion having a thickness smaller than the average thickness, the average thickness being measured in a direction perpendicular to the first main surface, and the thick film portion having a larger relative permittivity than the thin film portion; and
a conductor layer on the dielectric portion.

2. The capacitor according to claim 1, wherein
the substrate includes a recess in the first main surface,
the recess includes an upper end and a lower end,
the upper end is covered with the thick film portion, and
the lower end is covered with the thin film portion.

3. The capacitor according to claim 2, wherein
the at least one dielectric layer is a plurality of dielectric layers,
the plurality of dielectric layers include an outermost dielectric layer closest to the conductor layer and at least one inner dielectric layer closest to the substrate, and
the outermost dielectric layer has a larger maximum layer thickness than the inner dielectric layer.

4. The capacitor according to claim 3, wherein at least one of the plurality of dielectric layers is a doped dielectric layer containing an impurity that increases a relative permittivity of the doped dielectric layer.

5. The capacitor according to claim 4, wherein the thick film portion in the doped dielectric layer includes a region in which a concentration of the impurity is increased where the conductor layer is closest thereto, or a region in which a concentration of the impurity is increased where the substrate is closest thereto, in a direction perpendicular to the first main surface.

6. The capacitor according to claim 5, wherein the concentration of the impurity is increased where the conductor layer is closest thereto in the direction perpendicular to the first main surface in the thick film portion in the doped dielectric layer.

7. The capacitor according to claim 1, wherein
the at least one dielectric layer is a plurality of dielectric layers,
the plurality of dielectric layers include an outermost dielectric layer closest to the conductor layer and at least one inner dielectric layer closest to the substrate, and
the outermost dielectric layer has a larger maximum layer thickness than the inner dielectric layer.

8. The capacitor according to claim 7, wherein at least one of the plurality of dielectric layers is a doped dielectric layer containing an impurity that increases a relative permittivity of the doped dielectric layer.

9. The capacitor according to claim 8, wherein the thick film portion in the doped dielectric layer includes a region in which a concentration of the impurity is increased where the conductor layer is closest thereto, or a region in which a concentration of the impurity is increased where the substrate is closest thereto, in a direction perpendicular to the first main surface.

10. The capacitor according to claim 9, wherein the concentration of the impurity is increased where the conductor layer is closest thereto in the direction perpendicular to the first main surface in the thick film portion in the doped dielectric layer.

11. The capacitor according to claim 1, wherein the at least one dielectric layer is a doped dielectric layer containing an impurity that increases a relative permittivity of the doped dielectric layer.

12. The capacitor according to claim 11, wherein the thick film portion in the doped dielectric layer includes a region in which a concentration of the impurity is increased where the conductor layer is closest thereto, or a region in which a concentration of the impurity is increased where the substrate is closest thereto, in a direction perpendicular to the first main surface.

13. The capacitor according to claim 12, Wherein the concentration of the impurity is increased where the conductor layer is closest, thereto in the direction perpendicular to the first main surface in the thick film portion in the doped dielectric layer.

* * * * *